(12) United States Patent
Manzi et al.

(10) Patent No.: US 8,020,715 B2
(45) Date of Patent: Sep. 20, 2011

(54) STANDALONE OPEN FRAME (75) Inventors: Steven F. Manzi, Santa Clara, CA (US); Michael L. Wortman, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 670 days.

(21) Appl. No.: 11/804,110

(22) Filed: May 17, 2007

(65) Prior Publication Data

US 2008/0290051 A1 Nov. 27, 2008

(51) Int. Cl.
*A47B 43/00* (2006.01)

(52) U.S. Cl. ....... 211/194; 211/49.1; 361/724; 361/725; 361/726; 361/727; 206/722

(58) Field of Classification Search .................. 248/670, 248/222.41, 224.8, 346.01, 346.06; 211/194, 211/96, 41.17, 49.1, 41.12, 189, 182, 85.17, 211/188, 175; 361/725–727, 729, 730, 796; 206/722, 726, 728

See application file for complete search history.

(56) References Cited

U.S. PATENT DOCUMENTS

| | | | | |
|---|---|---|---|---|
| 1,835,042 | A * | 12/1931 | Hammer | 312/227 |
| 2,940,016 | A * | 6/1960 | Flint et al. | 361/809 |
| 3,303,937 | A * | 2/1967 | McConnell | 211/192 |
| 3,348,609 | A * | 10/1967 | Dubin et al. | 165/47 |
| 3,890,738 | A | 6/1975 | Bassani | |
| 4,165,944 | A * | 8/1979 | Sunasky | 403/254 |
| 4,558,797 | A | 12/1985 | Mitchell | |
| 4,564,884 | A * | 1/1986 | Kliemt et al. | 361/634 |
| 5,460,441 | A | 10/1995 | Hastings et al. | |
| 5,678,706 | A | 10/1997 | Husak et al. | |
| 5,684,671 | A | 11/1997 | Hobbs et al. | |
| 5,745,346 | A * | 4/1998 | Ogawa et al. | 361/769 |
| 5,808,237 | A * | 9/1998 | Hancock | 174/378 |
| 6,040,703 | A * | 3/2000 | Kimball | 324/755 |
| 6,044,990 | A | 4/2000 | Palmeri | |
| 6,123,314 | A * | 9/2000 | Steele | 248/681 |
| 6,266,250 | B1 * | 7/2001 | Foye | 361/760 |
| 6,292,359 | B1 * | 9/2001 | Boe | 361/679.58 |
| 6,354,550 | B2 * | 3/2002 | Jeong | 248/299.1 |
| 6,471,308 | B1 | 10/2002 | Konshak et al. | |
| 6,611,432 | B2 | 8/2003 | Blood | |
| 6,762,932 | B2 * | 7/2004 | Regimbal et al. | 361/679.33 |
| 6,783,298 | B2 * | 8/2004 | Root et al. | 403/315 |
| 6,839,237 | B2 | 1/2005 | Berry et al. | |
| 6,862,758 | B1 * | 3/2005 | Lai | 5/299 |
| 6,864,573 | B2 * | 3/2005 | Robertson et al. | 257/718 |
| 6,934,150 | B2 | 8/2005 | Kitchen et al. | |
| 6,988,626 | B2 | 1/2006 | Varghese et al. | |
| 7,014,051 | B2 * | 3/2006 | Rumney | 211/26 |
| 7,511,953 | B2 * | 3/2009 | Tao et al. | 361/679.39 |
| 2003/0213757 | A1 * | 11/2003 | Rumney | 211/26 |
| 2003/0213884 | A1 * | 11/2003 | Ikunami | 248/346.01 |

(Continued)

FOREIGN PATENT DOCUMENTS

CA 2197354 2/1997

(Continued)

*Primary Examiner* — Darnell Jayne
*Assistant Examiner* — Devin Barnett (57) ABSTRACT

A standalone open frame of an apparatus in one example is configured to support a rack-mount electronic component of a predetermined size selected from any of a plurality of predetermined sizes. The standalone open frame is configured to securely engage the rack-mount electronic component through employment of at least one set of rack-mount adapters that is configured for the predetermined size of the rack-mount electronic component.

9 Claims, 12 Drawing Sheets

U.S. PATENT DOCUMENTS

| | | | |
|---|---|---|---|
| 2004/0105655 A1* | 6/2004 | Ciulla | 386/46 |
| 2004/0164216 A1* | 8/2004 | Chen | 248/346.01 |
| 2005/0061755 A1* | 3/2005 | Davis et al. | 211/26 |
| 2006/0180555 A1* | 8/2006 | Shih et al. | 211/26 |
| 2007/0069096 A1* | 3/2007 | VonHeck | 248/346.01 |
| 2007/0109754 A1* | 5/2007 | Mueller et al. | 361/729 |
| 2007/0109755 A1* | 5/2007 | Mueller et al. | 361/729 |
| 2008/0035588 A1* | 2/2008 | Liang | 211/26 |
| 2009/0101603 A1* | 4/2009 | Hilburn et al. | 211/26 |
| 2009/0114785 A1* | 5/2009 | Huang et al. | 248/220.31 |

FOREIGN PATENT DOCUMENTS

| | | |
|---|---|---|
| FR | 1173744 A | 4/1957 |
| JP | 08111593 A | 4/1996 |

* cited by examiner

STANDALONE OPEN FRAME

BACKGROUND

Large data centers for electronic components such as servers and storage arrays are typically designed for rack-mount equipment. Rack-mount equipment allows dense arrangements of servers, but with a large setup cost for purchasing and installing a rack or cabinet. For smaller scale server environments, a single rack-mount electronic component may be mounted within an enclosure. Rack-mount enclosures typically use a framework with sheet metal or plastic skins to support the electronic component. The framework may also include a separate support foot for stability.

SUMMARY

The invention in one implementation encompasses an apparatus. The apparatus comprises a standalone open frame configured to support a rack-mount electronic component of a predetermined size selected from any of a plurality of predetermined sizes. The standalone open frame is configured to securely engage the rack-mount electronic component through employment of at least one set of rack-mount adapters that is configured for the predetermined size of the rack-mount electronic component.

Another implementation of the invention encompasses a method. At least one set of rack-mount adapters is engaged with a standalone open frame. The at least one set of rack-mount adapters are configured for a predetermined size of a rack-mount electronic component. The rack-mount electronic component is engaged with the at least one set of rack-mount adapters to securely engage the rack-mount electronic component to the standalone open frame.

DESCRIPTION OF THE DRAWINGS

Features of example implementations of the invention will become apparent from the description, the claims, and the accompanying drawings in which:

DETAILED DESCRIPTION

Referring to the BACKGROUND section above, the rack-mount enclosures restrict access to the electronic component. In addition, a separate rack-mount enclosure is required for each electronic component.

Figure 1:
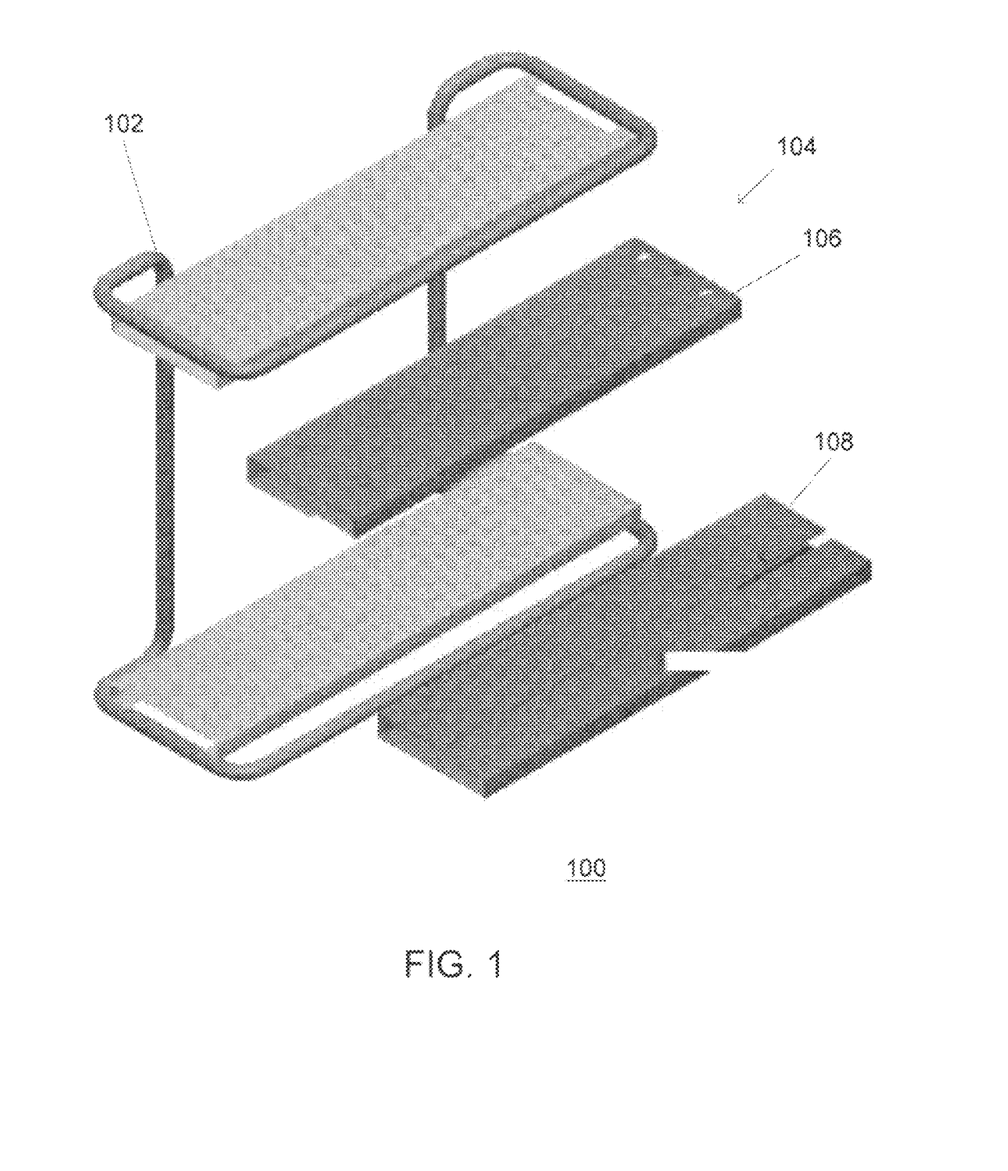
FIG. 1 is a representation of one implementation of an apparatus that comprises a standalone open frame and at least one set of rack-mount adapters.

Turning to FIG. 1, an apparatus 100 in one example comprises a standalone open frame 102 and at least one set of rack-mount adapters 104. The standalone open frame 102 is configured to support at least one rack-mount electronic component. For example, the standalone open frame 102 and the set of rack-mount adapters 104 are compliant with the Electronic Industries Alliance ("EIA") RS-310 standard. The standalone open frame 102 in one example is configurable to support any of a plurality of predetermined sizes of the rack-mount electronic component, for example, 1U, 2U, 4U, etc. In another example, the standalone open frame 102 is configurable to support other electronic components that are not inherently rack-mountable. The standalone open frame 102 in one example comprises a tubular structure that allows the standalone open frame 102 and any rack-mount electronic equipment coupled with it to be moved or slid along a floor, including but not limited to carpeted surfaces.

The rack-mount adapters 104 in one example serve to couple at least one electronic component with the standalone open frame 102. In the implementation of FIG. 1, the set of rack-mount adapters 104 comprises a first adapter 106 and a second adapter 108. The first and second adapters 106 and 108 in one example are configured to couple opposing sides of a rack-mount electronic component to the standalone open frame 102.

Figure 2:
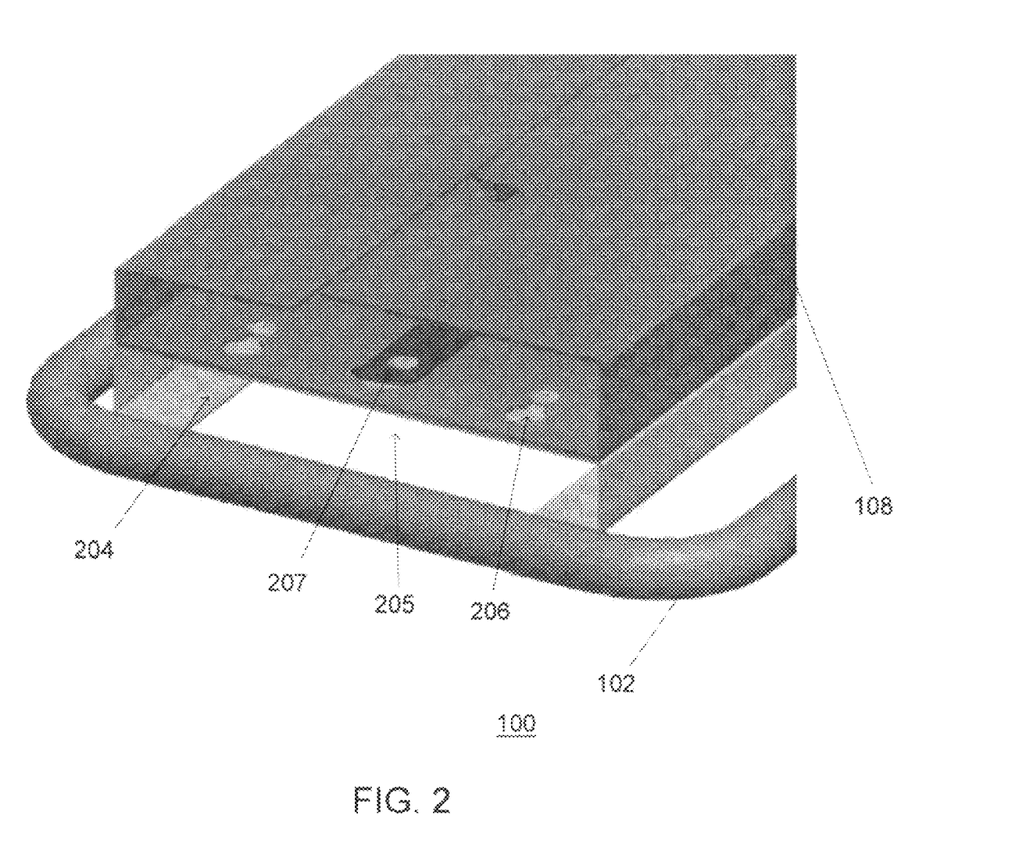
FIG. 2 is a representation of partial perspective view of a first keyhole coupling between the standalone open frame and the at least one set of rack-mount adapters of the apparatus of FIG. 1.

Turning to FIG. 2, the set of rack-mount adapters 104 in one example comprise at least one keyhole coupling with the standalone open frame 102, for example, keyhole couplings 204, 205, and 206. In a further example, one or more of the keyhole couplings is securable with a spring clip 207. For example, the rack-mount adapter 104 comprises a keyhole and the standalone open frame 102 comprises a pin. The keyhole is placed over the pin and slid back to prevent the rack-mount adapter 104 from disengaging from the standalone open frame 102. The spring clip 207 prevents the rack-mount adapter 104 from sliding back and disengaging from the keyhole coupling. The keyhole coupling allows the rack-mount adapters 104 to be coupled with or removed from the standalone open frame 102 without tools, as will be appreciated by those skilled in the art.

Figure 3:
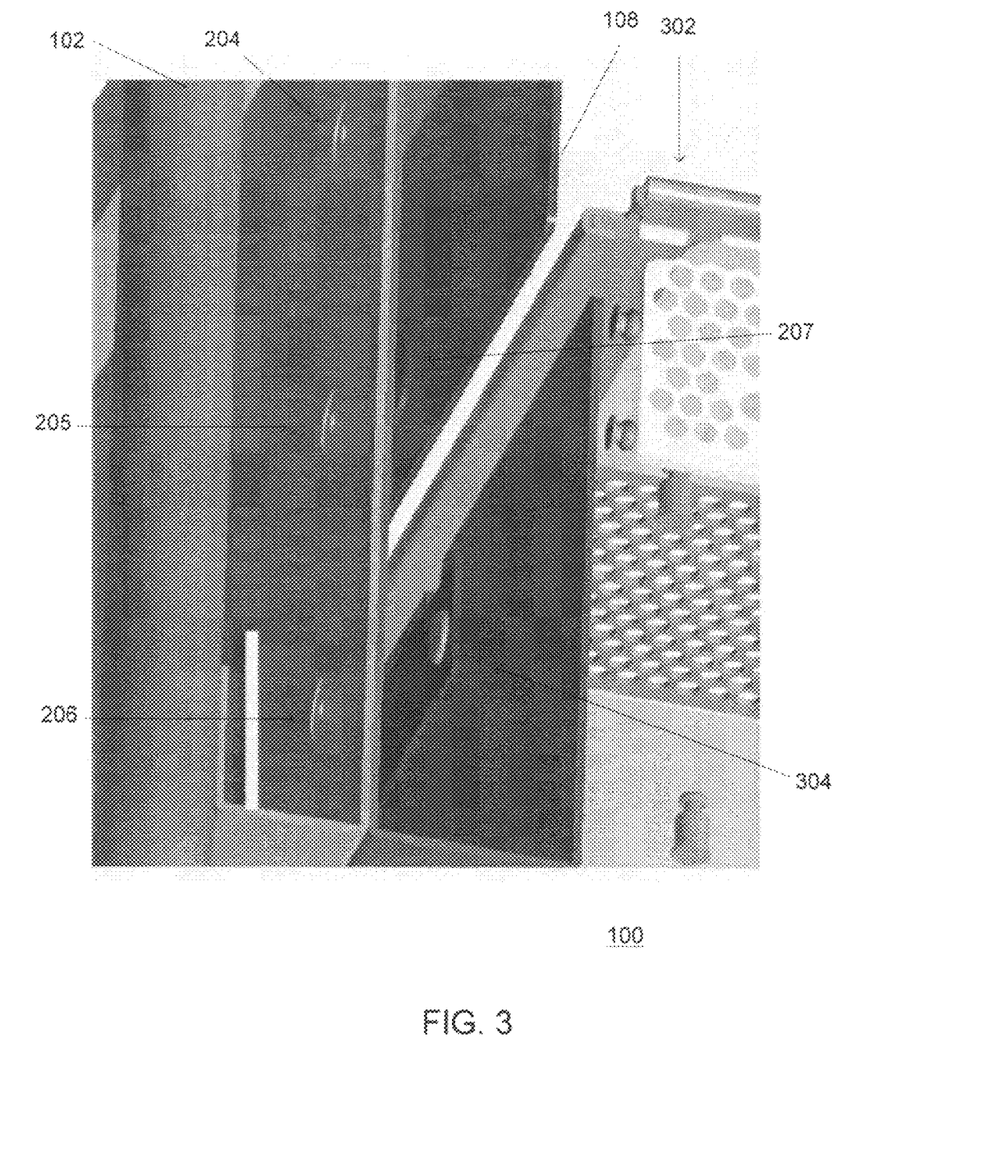
FIG. 3 is a representation of partial perspective view of a second keyhole coupling between the at least one set of rack-mount adapters of FIG. 1 and a rack-mount electronic component.

Turning to FIG. 3, an electronic component 302 in one example is coupled with the rack-mount adapters 104. The electronic component 302 in one example comprises a rack-mount electronic component that is compliant with the Electronic Industries Alliance ("EIA") RS-310 standard. The electronic component 302 and the rack-mount adapters 104 in one example comprise a keyhole coupling 304. The spring clip 207 in one example secures the keyhole coupling 304. In another example, a separate spring clip secures the keyhole coupling 304. The electronic component 302 in one example is engaged with the rack-mount adapter 104 by sliding the electronic component 302 into the standalone open frame 102.

Figure 4:
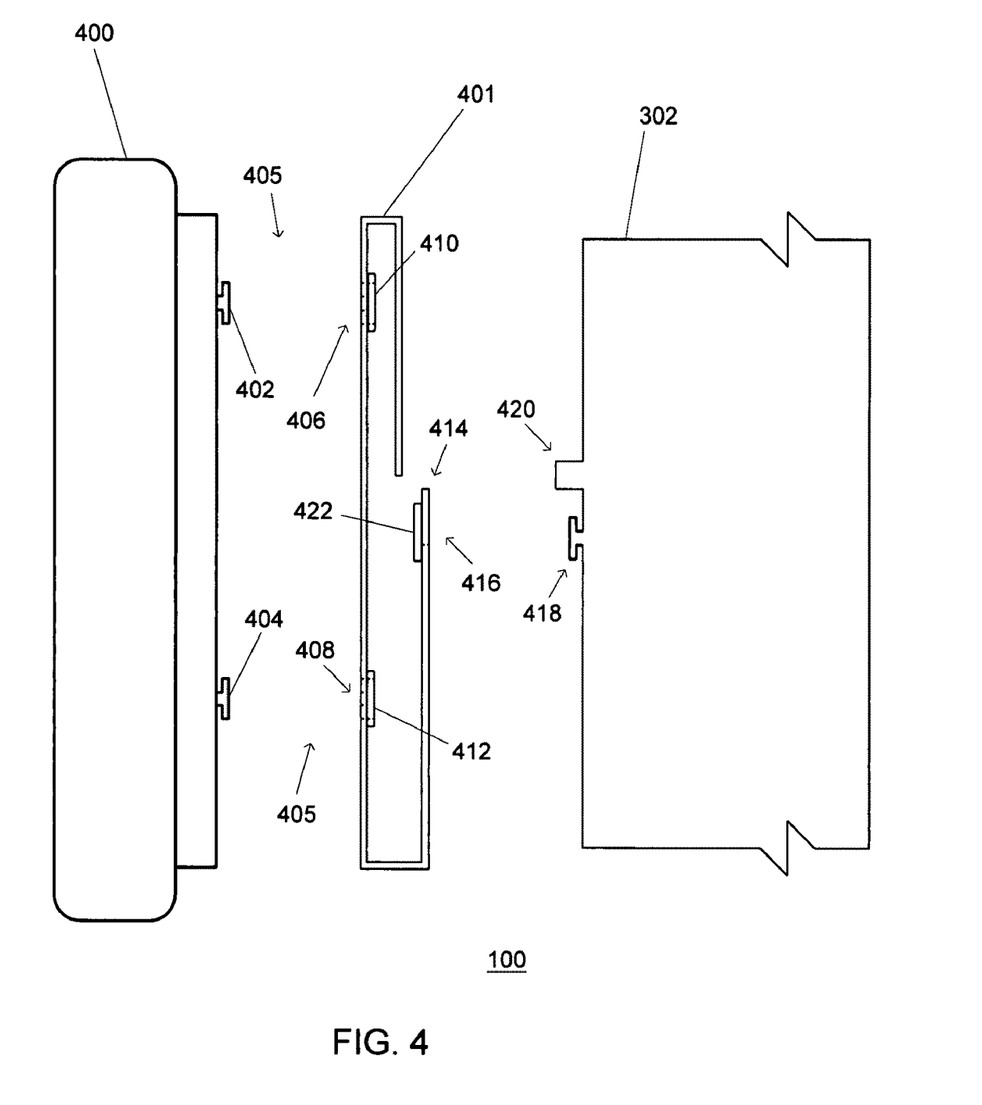
FIG. 4 is a representation of a partial front exploded view of the apparatus of FIG. 1 supporting a 4U rack-mount electronic component.
Figure 5:
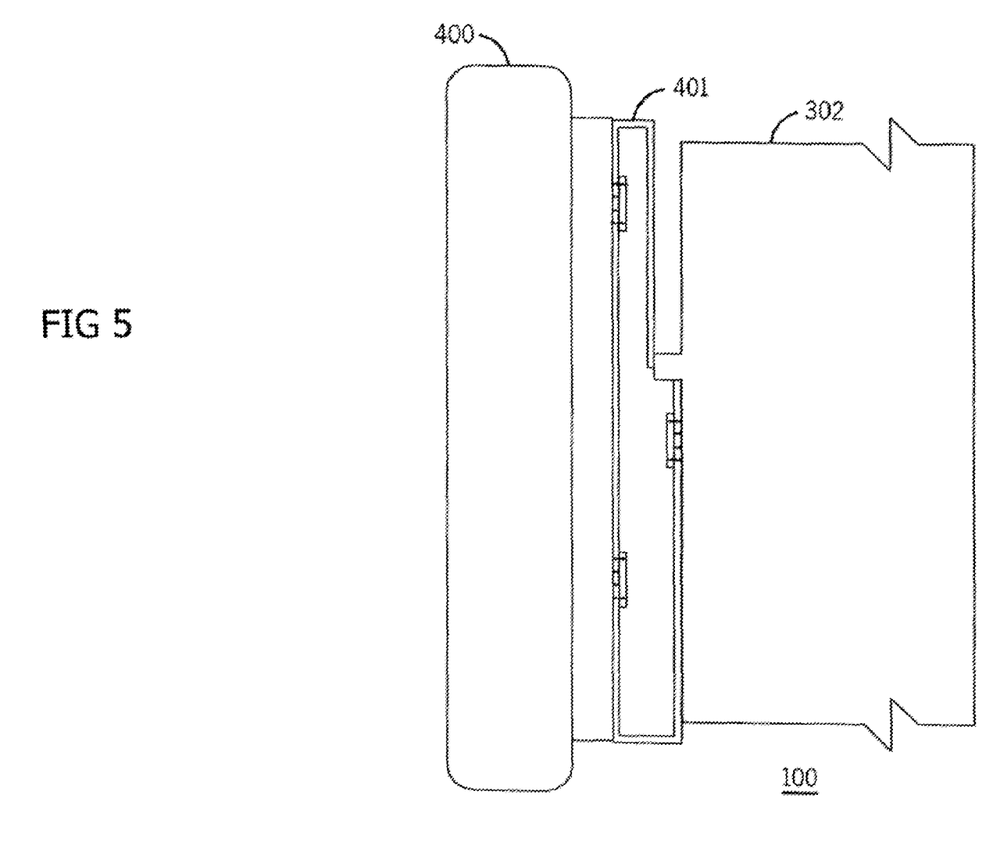
FIG. 5 is a representation of a partial front view of the apparatus of FIG. 4 supporting the 4U rack-mount electronic component.

Turning to FIGS. 4-5, in one implementation of the apparatus 100 a standalone open frame 400 with a rack-mount adapter 401 supports the electronic component 302. The standalone open frame 400 comprises pins 402 and 404 for keyhole couplings 405 with the rack-mount adapter 401. The keyhole couplings 405 in one example are analogous to keyhole couplings 204, 205, and 206. The rack-mount adapter 401 in one example comprises keyholes 406 and 408 for the keyhole couplings 405. In a further example, the rack-mount adapter 401 comprises spring clips 410 and 412 for securing the keyhole couplings 405. For example, the pin 402 slides into the keyhole 406 and is secured into place by the spring clip 410, as will be appreciated by those skilled in the art.

The rack-mount adapter 401 in one example comprises a lip 414 with a slot 416 for engaging the electronic component 302. The electronic component 302 in one example comprises a pin 418 and a rail 420. In one example, the electronic component 302 is slid back with the pin 418 on the lip 414 until the pin 418 drops into the slot 416 and the rail 420 then engages the lip 414. The slot 416 in one example comprises a dogleg shape to secure the pin 418. In this example, the rail 420 supports the weight of the electronic component 302 and the pin 418 prevents further movement of the electronic component. The rack-mount adapter 401 in one example comprises a spring clip 422 to secure the pin 418 within the slot 416.

Figure 6:
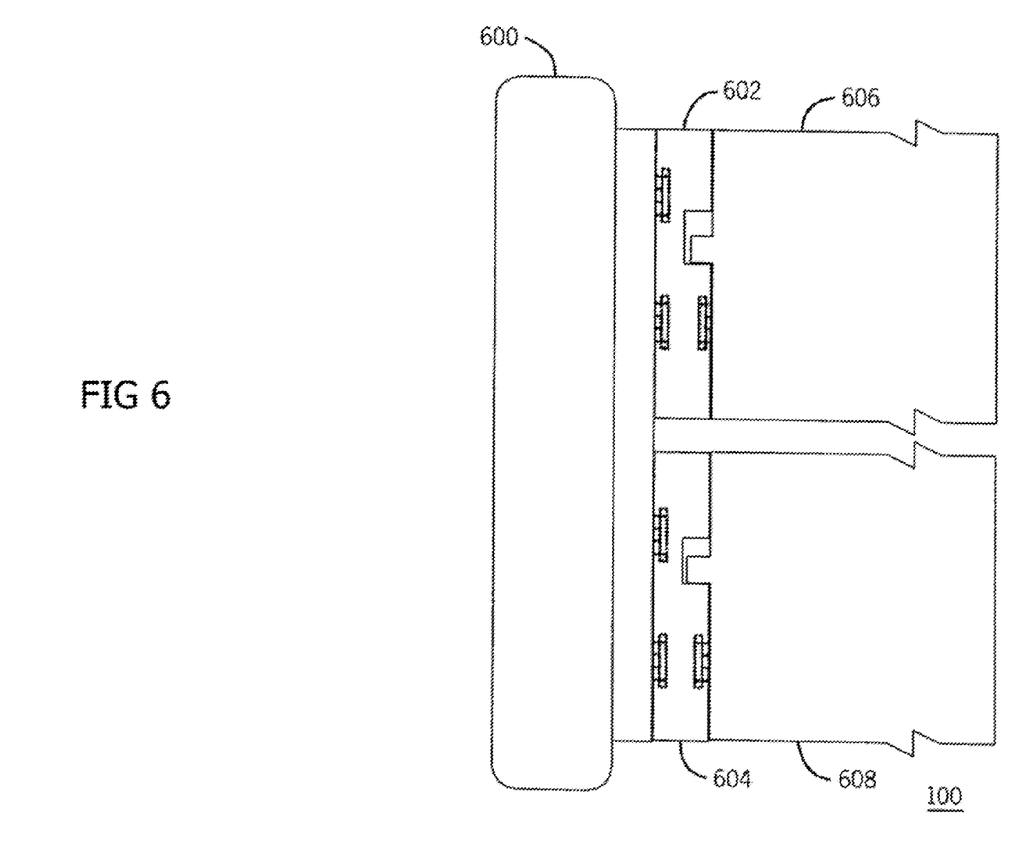
FIG. 6 is a representation of a partial front view of the apparatus of FIG. 1 supporting two 2U rack-mount electronic components.

Turning to FIG. 6, in another implementation of the apparatus 100, a standalone open frame 600, a first rack-mount adapter 602, and a second rack-mount adapter 604 are configured to support a first electronic component 606 and a second electronic component 608. In alternative implementations, the standalone open frame 600 may be configured to support additional rack-mount adapters and electronic components.

Figure 7:
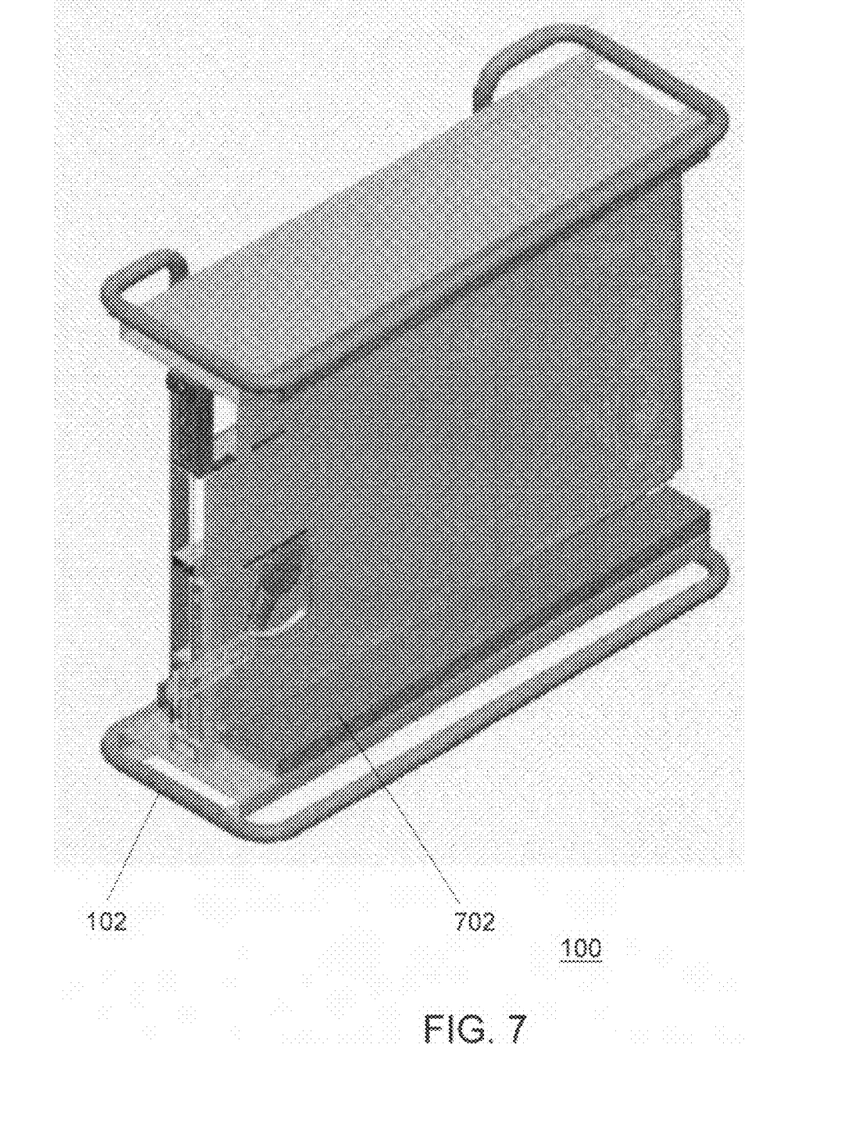
FIG. 7 is a representation of the apparatus of FIG. 1 supporting a 1U rack-mount electronic component.
Figure 8:
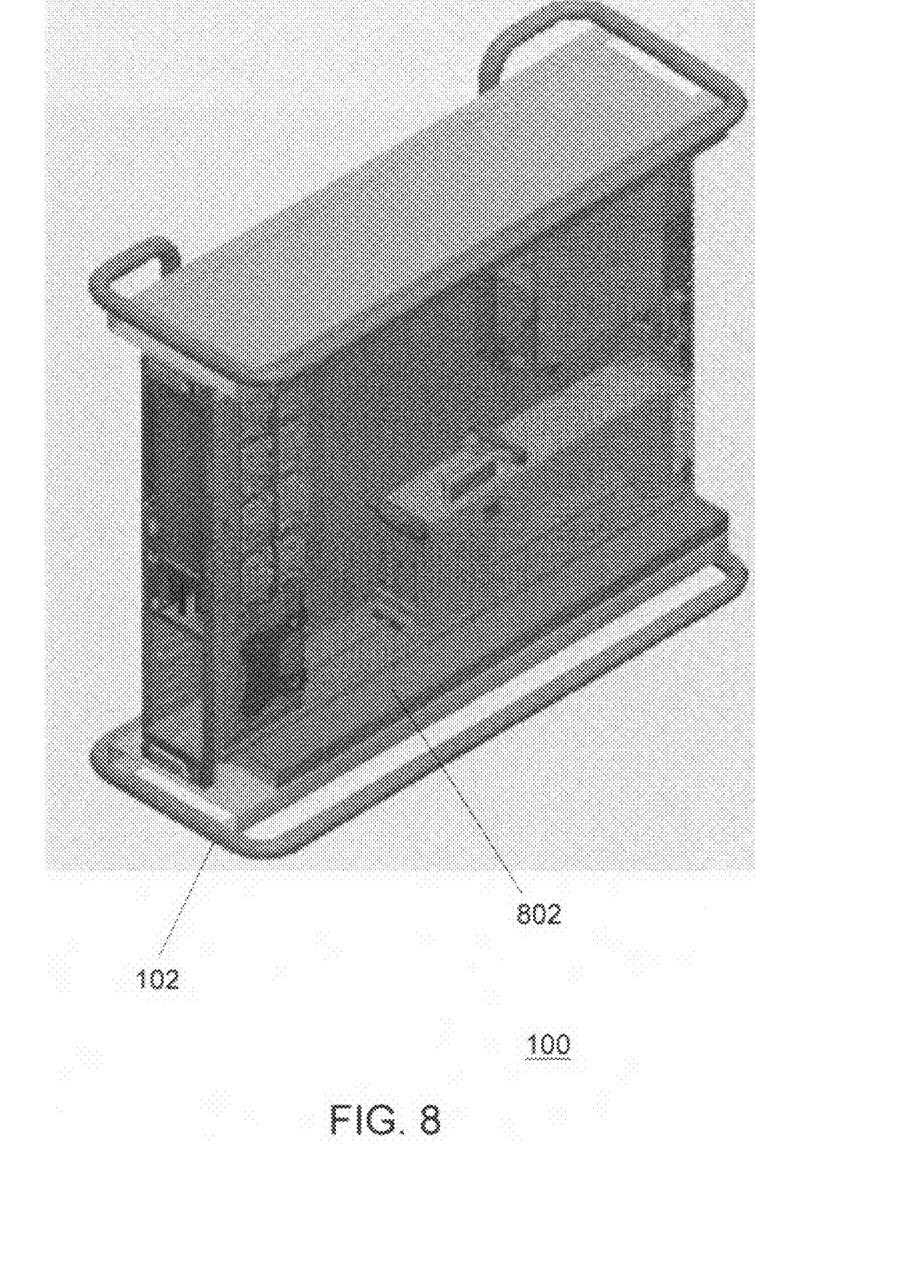
FIG. 8 is a representation of the apparatus of FIG. 1 supporting a 2U rack-mount electronic component.
Figure 9:
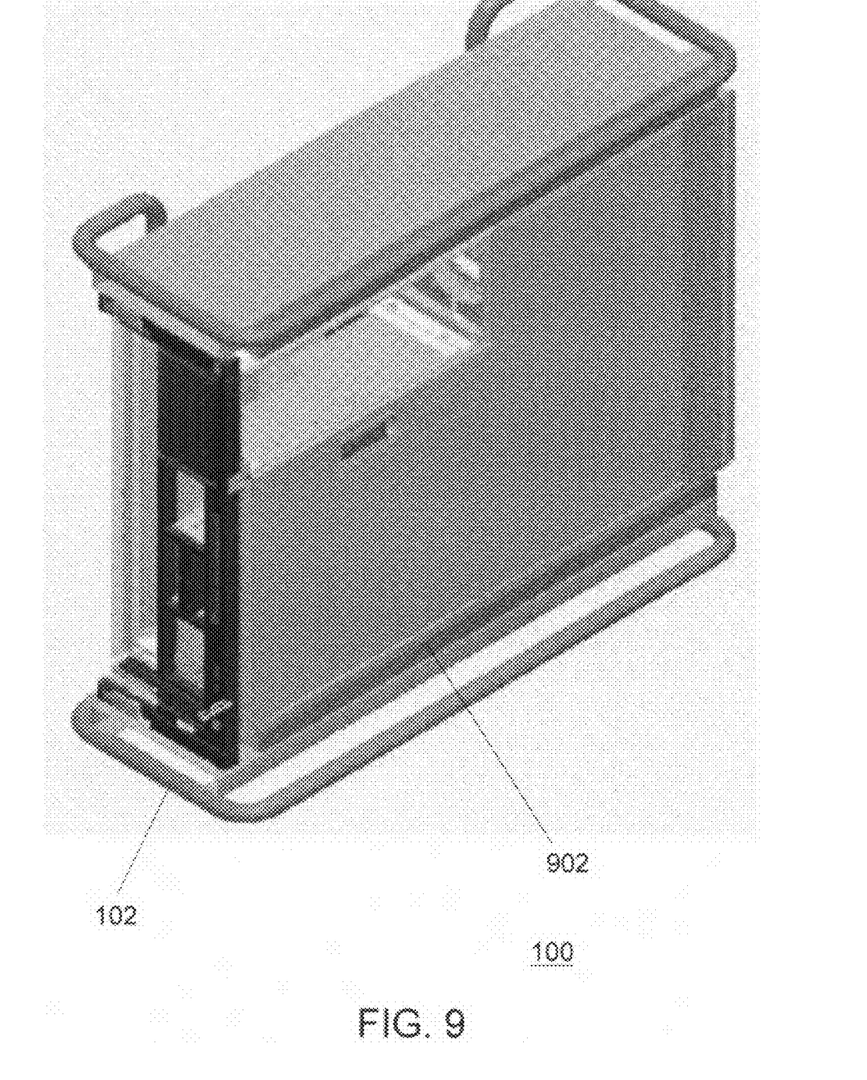
FIG. 9 is a representation of the apparatus of FIG. 1 supporting a 4U rack-mount electronic component.

Turning to FIGS. 7-9, alternative implementations of the rack-mount adapters 104 are shown with the standalone open frame 102. In FIG. 7, a set of rack-mount adapters 702 is configured to support a 1U electronic component. In FIG. 8, a set of rack-mount adapters 802 is configured to support a 2U electronic component. Referring to FIG. 9, a set of rack-mount adapters 902 is configured to support a 4U electronic component. Additional configurations and sizes for the rack-mount adapters 104 may be developed to accommodate additional designs for rack-mount electronic equipment, as will be appreciated by those skilled in the art.

Figure 10:
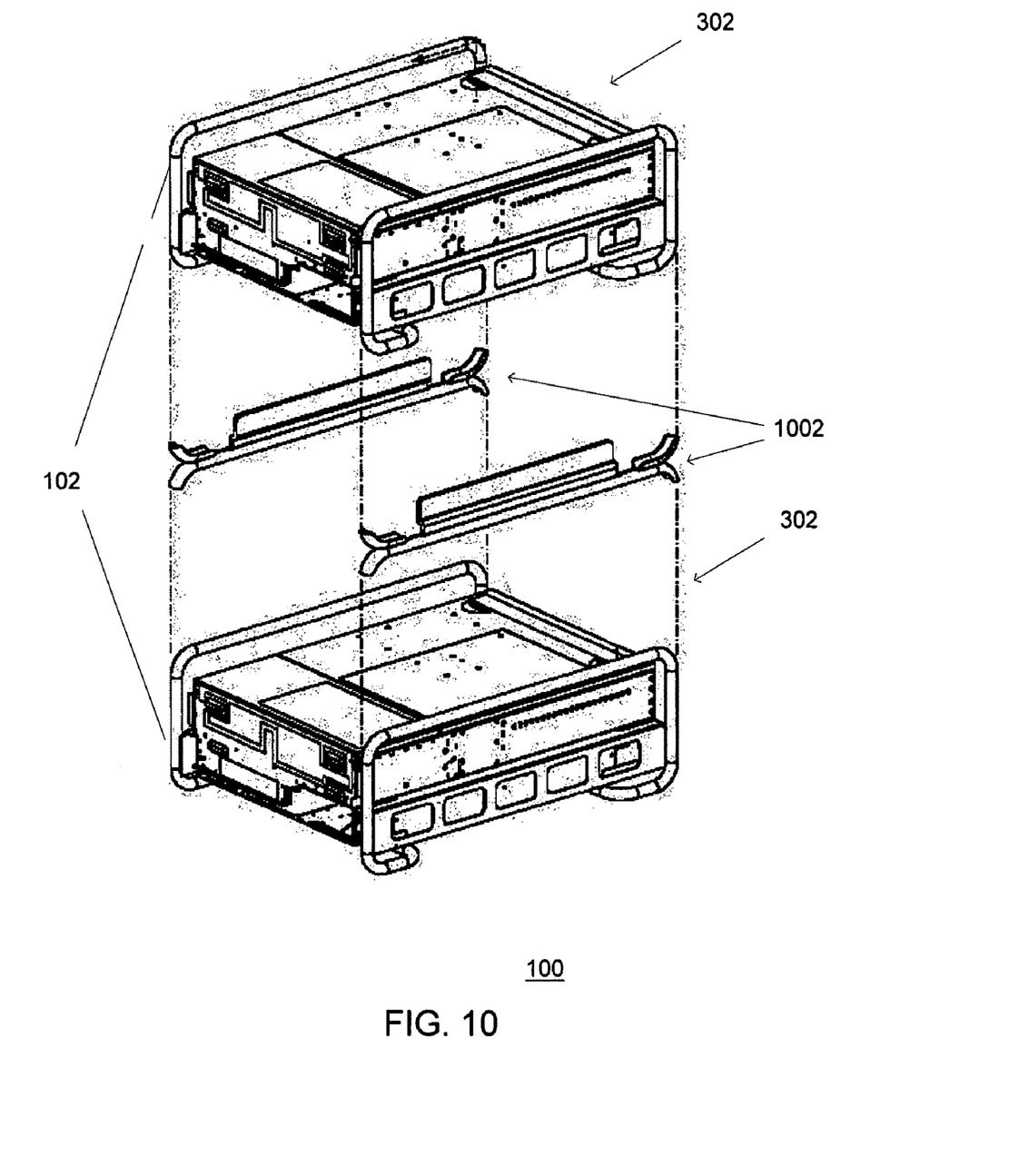
FIG. 10 is a representation of the apparatus of FIG. 1 in a stacked arrangement with at least one stacking bracket.

Turning to FIG. 10, the standalone open frame 102 in one example is configured to receive at least one stacking bracket 1002. The stacking bracket 702 allows at least two standalone open frames 102 to be coupled in a stacked configuration. In the example of FIG. 10, two instances of the standalone open frame 102 are stacked vertically. The standalone open frame 102 allows a user to use rack-mount electronic equipment without the initial expense of a rack-mount system or cabinet. The standalone open frame 102 also allows the user to position the rack-mount electronic equipment horizontally or vertically, for example, for a stacking configuration or a smaller footprint.

Figure 11A:
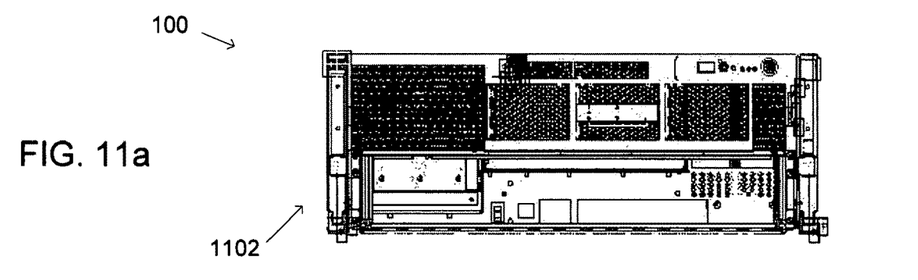
FIG. 11 is a representation of an alternative implementation of the apparatus of FIG. 1 supporting an electronic component.
Figure 11B:
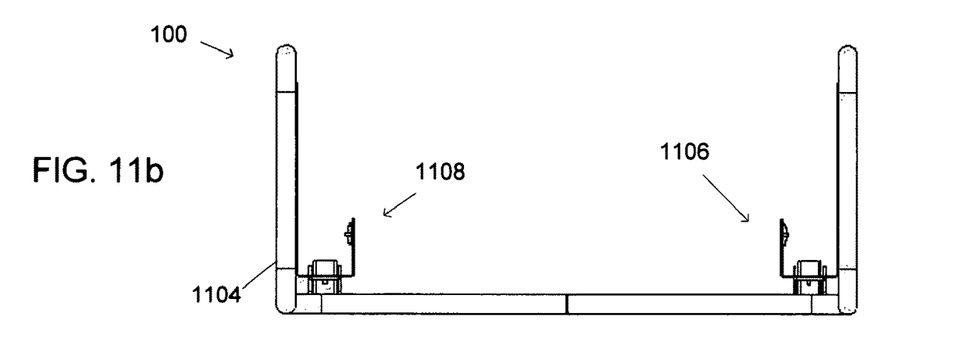
Figure 11C:
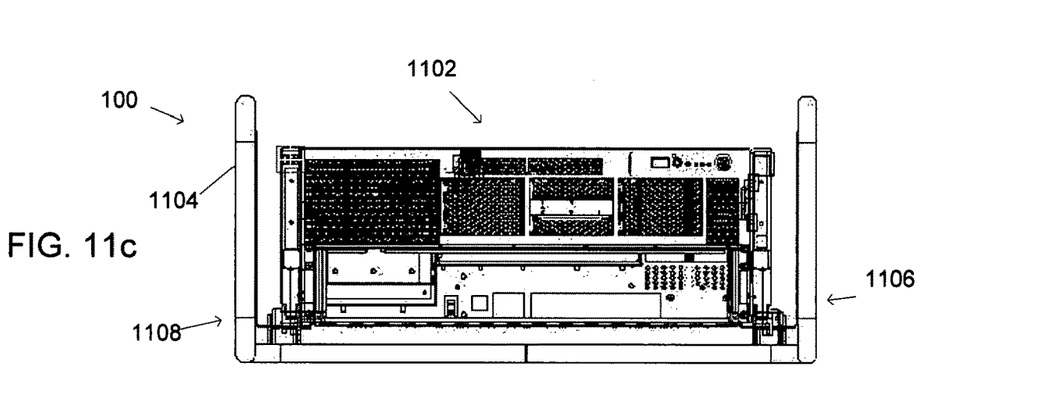

Turning to FIG. 11, another implementation of the apparatus 100 comprises a standalone open frame 1104 with a first rack-mount adapter 1106 and a second rack-mount adapter 1108 (FIG. 11b). The rack-mount adapters 1106 and 1108 are configured to support an electronic component 1102 (FIG. 11a). Referring to FIG. 11c, the standalone open frame 1104 allows for access to the electronic component 1102.

Figure 12:
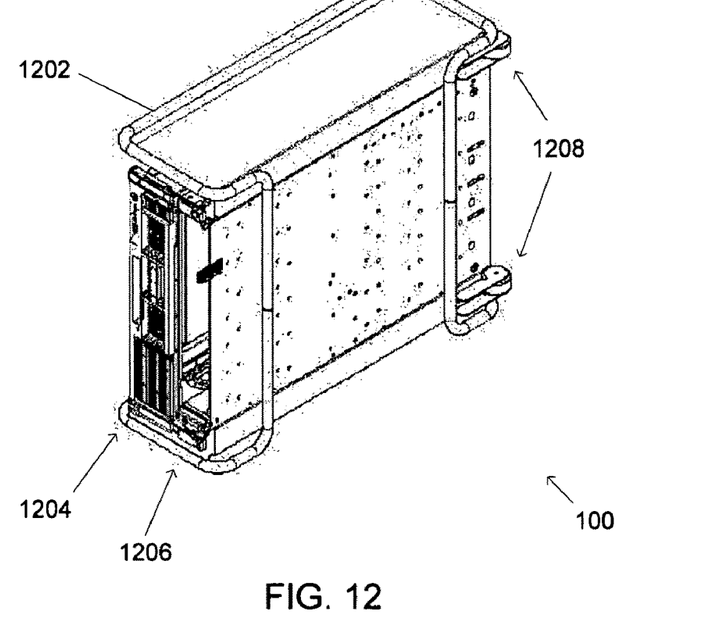
FIG. 12 is a representation of another implementation of the apparatus of FIG. 1.

Turning to FIG. 12, yet another implementation of the apparatus 100 comprises a standalone open frame 1202. The standalone open frame 1202 is configured to support a first electronic component 1204 with a first set of rack-mount adapters (not shown) and has available space 1206 for a second electronic component, for example, for future expansion. In one example, the electronic component 1204 comprises a 4U server and the available space 1206 is sufficient for an additional 2U server (not shown). The standalone open frame 1202 in one example comprises a wheeled arrangement 1208 for moving the standalone open frame 1202 (and any attached electronic components) along a floor. For example, a user may pick up or partially lift weight off a front of the standalone open frame 1202 to allow wheels of the wheeled arrangement 1208 to roll on the floor.

Figure 13:
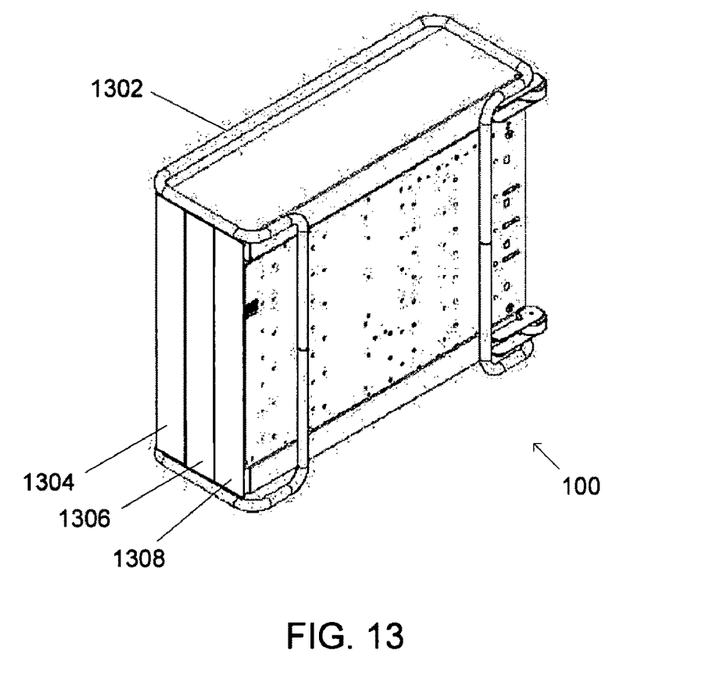
FIG. 13 is a representation of yet another implementation of the apparatus of FIG. 1.

Turning to FIG. 13, another implementation of the apparatus 100 comprises a standalone open frame 1302. The standalone open frame 1302 in this example is configured to support three electronic components 1304, 1306, and 1308.

Numerous alternative implementations of the present invention exist. In addition to various configurations of the rack-mount adapters 104, the spring clips 207 may be replaced or supplemented with latches, locking mechanisms, or other securement devices. Alternative configurations and shapes of the standalone open frame 102 may also be used. In one implementation, a larger standalone open frame may be built to support a larger number of rack-mount electronic components. For example, a larger standalone open frame may be sized to support up to ten 10U components, five 2U components, or other configurations.

In another implementation, the standalone open frame 102 is configured to support a plurality of electronic components. For example, the standalone open frame 102 may receive a first set of rack-mount adapters for a first rack-mount electronic component and a second set of rack-mount adapters for a second rack-mount electronic component. In this implementation, a single standalone open frame 102 may support four 1U components, two 2U components, one 3U component and one 1U component, and other configurations, as will be appreciated by those skilled in the art.

The standalone open frame 102 in one example comprises dimensions that are selected for stability in multiple orientations. Referring to FIGS. 7-9, the standalone open frame 102 comprises a vertical orientation. The vertical orientation allows for a reduced footprint of the standalone open frame 102 and electronic components. Referring to FIG. 10, the standalone open frame 102 comprises a horizontal orientation. The horizontal orientation allows for stacking of the standalone open frame 102.

The apparatus 100 in one example comprises a plurality of components such as one or more of hardware components. A number of such components can be combined or divided in the apparatus 100. The apparatus 100 in one example comprises any (e.g., horizontal, oblique, or vertical) orientation, with the description and figures herein illustrating one example orientation of the apparatus 100, for explanatory purposes.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus in combination with a plurality of rack mount electronic components, comprising:
   a standalone open frame configured to support a plurality of rack-mount electronic components of predetermined sizes selected from any of a plurality of predetermined sizes;
   wherein the standalone open frame is configured to securely engage the plurality of rack-mount electronic components through employment of at least one set of rack-mount adapters that is configured for the predetermined size of the rack-mount electronic component wherein a unique set of rack-mount adapters is used for each rack-mount electronic component of the plurality of rack-mount electronic components;
   wherein each of the rack-mount electronic components comprises a pin and a rail;
   wherein the at least one set of rack-mount adapters comprises a slot configured to receive the pin of the rack-mount electronic component and a lip to receive the rail of the rack-mount electronic component such that the weight of the rack-mount electronic component is supported by the rail, wherein the at least one set of rack-mount adapters is operable to couple the rack-mount electronic component to or remove the rack-mount electronic component from the standalone open frame without tools; and
   wherein the standalone open frame is configured to engage the at least one rack-mount adapter through employment of at least one first keyhole coupling, wherein the at least one first keyhole coupling of the at least one set of rack-mount adapters and the standalone open frame is securable with at least one first spring clip.

2. The apparatus of claim 1, wherein the standalone open frame is configured to support a first rack-mount electronic component of a first predetermined size with a first set of rack-mount adapters;
   wherein the standalone open frame is configured to support a second rack-mount electronic component of a second predetermined size with a second set of rack-mount adapters.

3. The apparatus of claim 1, wherein the at least one set of rack-mount adapters is configured to engage the rack-mount electronic component through employment of at least one second keyhole coupling.

4. The apparatus of claim 3, wherein the at least one second keyhole coupling of the at least one set of rack-mount adapters and the rack-mount electronic component is securable with one or more of the at least one first spring clip and at least one second spring clip.

5. The apparatus of claim 1, wherein the at least one set of rack-mount adapters comprises a first adapter and a second adapter that are configured to couple opposing sides of the rack-mount electronic component to the standalone open frame.

6. The apparatus of claim 1, wherein the standalone open frame comprises a tubular structure that allows the standalone open frame to be slidably moved on a surface.

7. The apparatus of claim 1, wherein the standalone open frame is configured to support a rack-mount electronic component in compliance with the Electronic Industries Alliance ("EIA") RS-310 standard.

8. The apparatus of claim 7, wherein the plurality of predetermined sizes comprise any of a 1U size, 2U size, 3U size, and 4U size.

9. The apparatus of claim 1, wherein the standalone open frame allows tool-less access to the rack-mount electronic component when coupled with the standalone open frame.

* * * * *